(12) United States Patent
Salter, III et al.

(10) Patent No.: US 6,252,273 B1
(45) Date of Patent: Jun. 26, 2001

(54) NONVOLATILE REPROGRAMMABLE INTERCONNECT CELL WITH FN TUNNELING DEVICE FOR PROGRAMMING AND ERASE

(75) Inventors: Robert M. Salter, III, Saratoga; Robert J. Lipp, Los Gatos; Kyung Joon Han, Cupertino; Jack Zezhong Peng, San Jose, all of CA (US)

(73) Assignee: Actel Corporation, Sunnyvale, CA (US)

( * ) Notice: Subject to any disclaimer, the term of this patent is extended or adjusted under 35 U.S.C. 154(b) by 0 days.

(21) Appl. No.: 09/138,838

(22) Filed: Aug. 24, 1998

Related U.S. Application Data

(63) Continuation-in-part of application No. 08/708,074, filed on Aug. 9, 1996, now Pat. No. 5,894,148, and a continuation-in-part of application No. 08/704,853, filed on Aug. 27, 1996, now Pat. No. 5,773,862, and a continuation-in-part of application No. 08/829,374, filed on Mar. 31, 1997, now Pat. No. 5,838,040.

(51) Int. Cl.[7] .................................................. H01L 29/788
(52) U.S. Cl. ........................... 257/316; 257/318; 257/321
(58) Field of Search .................................... 257/315, 316, 257/318, 321; 365/185.28, 185.05, 185.1

(56) References Cited

U.S. PATENT DOCUMENTS

| | | | |
|---|---|---|---|
| 4,715,014 | * 12/1987 | Tuvell et al. | 365/185 |
| 6,072,720 | * 6/2000 | Peng et al. | 365/185.05 |

* cited by examiner

Primary Examiner—Sara Crane
(74) Attorney, Agent, or Firm—Jonathan H. Schafer

(57) ABSTRACT

A programmable interconnect cell for selectively connecting circuit nodes of a field programmable integrated circuit array in a semiconductor substrate includes a switch field effect transistor, a sense field effect transistor, and an electron tunneling device with the transistors and electron tunneling device having interconnected floating gates and interconnected control gates. The floating gates comprise a first polysilicon layer which is restricted to each cell, and the control gates comprise a second polysilicon layer which extends to adjacent cells in the row. The source/drain regions of the sense transistor extend to source/drain regions of sense amplifiers in adjacent rows. Programming and erasing of the switch transistor is effected entirely by electron tunneling in the electron tunneling device.

17 Claims, 9 Drawing Sheets

NONVOLATILE REPROGRAMMABLE INTERCONNECT CELL WITH FN TUNNELING DEVICE FOR PROGRAMMING AND ERASE

This patent application is a continuation in part of patent application Ser. No. 08/708,074 filed Aug. 9, 1996 now U.S. Pat. No. 5,894,148; Ser. No. 08/704,853 filed Aug. 27, 1996 now U.S. Pat. No. 5,773,862; and Ser. No. 08/829,374, filed Mar. 31, 1997 now U.S. Pat. No. 5,838,040.

BACKGROUND OF THE INVENTION

The present invention is related to field programmable integrated circuits, especially Field Programmable Gate Arrays (FPGAs), and more particularly, to floating gate MOS transistors used as switching elements in a field programmable gate array FPGA.

An FPGA cell is a combination of circuit elements which act as a single nonvolatile switch. Its function is to electrically connect or isolate two nodes in the FPGA circuit array.

Typically, an FPGA has an array of logic elements and wiring interconnections with thousands, or even tens of thousands, of programmable interconnects so that the FPGA can be configured by the user into an integrated circuit with defined functions. Each programmable interconnect, or switch, can connect two circuit nodes in the integrated circuit to make (or break) a wiring interconnection or to set the function or functions of a logic element.

FPGAs use either memory cells or antifuses for the programmable interconnect. Memory cells are reprogrammable and antifuses are programmable only once. A new non-volatile memory-type of programmable interconnect is disclosed in a patent application, U.S. application Ser. No. 08/754,116, entitled, "A GENERAL PURPOSE, NON-VOLATILE REPROGRAMMABLE SWITCH," filed Nov. 21, 1996 by Robert J. Lipp, Richard D. Freeman, Robert U. Broze, John M. Caywood, and Joseph G. Nolan, III, and assigned to the present assignee. In the FPGA described in the patent application, a non-volatile reprogrammable transistor memory (NVM) cell is used to provide a general purpose switching element to randomly interconnect FPGA wiring and circuit elements. Basically an NVM cell has an MOS transistor with a floating gate which may be charged and/or discharged. Charging and/or discharging the floating gate provides for the non-volatile programmability feature of NVM technologies.

In an FPGA, indeed, in any integrated circuit, it is important that the elements of the FPGA be as compact as possible for an efficient layout of the circuit and be as easily manufactured as possible. Robert U. Broze, U.S. Pat. No. 5,633,518 issued May 27, 1997 for "Non-Volatile Reprogrammable Interconnect Cell with FN Tunneling and Programming" and assigned to the present assignee is directed toward highly compact cells of one of the programmable interconnects described in patent application Ser. No. 08/754,116, supra. An efficient array of such interconnects, each of which is selectively programmable, is achieved. Each programmable interconnect cell has a first MOS transistor having first and second source/drains connected to first and second circuit nodes respectively, and a floating gate for turning the first MOS transistor off and on at a threshold responsive to the amount of charge on the gate. The cell also has a tunneling device with one terminal connected to the floating gate of the first MOS transistor and coupled to a programming/erase line through a tunneling oxide layer, a control gate capacitively coupled to the floating gate, and at least one tunneling control line for controllably inhibiting tunneling through the oxide layer. The tunneling control line and the programming/erase line form a PN junction which is close to, but laterally displaced from, the region below the tunneling oxide layer. Under a reverse bias, the charge depletion region of the junction extends through the region below the tunneling oxide to block tunneling. This permits each programmable interconnect to be selectively programmable.

Co-pending applications Ser. No. 08/708,074 filed Aug. 9, 1996 and Ser. No. 08/704,853 filed Aug. 27, 1996 disclose FPGA cells having an EPROM split gate sense transistor, a switch transistor and a Fowler-Nordheim (FN) tunnelling device, all having interconnected floating gates. Programming of the cell is by hot electron injection of electrons to the floating gate in the EPROM transistor, and erase of the cell is by electron tunneling from the floating gate in the FN device. Thus, the switch transistor is programmed off by hot injection of electrons to the floating gate in the EPROM device, and the switch transistor is erased on by tunneling of electrons from the floating gate in the FN device.

SUMMARY OF THE INVENTION

The present invention is directed to an FPGA programming interconnect cell in a semiconductor substrate including a floating gate MOS switch transistor, a floating gate MOS sense transistor, and a FN tunneling device with the floating gates of both transistors and the FN device interconnected. The FN device is employed for both programming the cell and erasing the cell through electron tunneling between the floating gate and a voltage biased conductive line underlying the floating gate.

The layout of the cell employs a first polysilicon layer for the common floating gates and a second polysilicon layer for the common control gates. The two polysilicon layers are preferably self-aligned with the first polysilicon layer being restricted to a cell while the second polysilicon layer extends to adjacent cells in a row. The conductive line for the FN device is preferably a buried N+(BN+) layer in the semiconductor substrate and runs to FN devices in adjacent cells. The drains of the switch and sense transistors are contiguous with respective source regions of the transistors of an adjacent cell in another row.

In an alternative embodiment, the BN+ line is replaced by a metal column line. A half contact per cell must be added from the column metal line to an N+ doped region on one side of the FN tunnel device under the tunnel oxide.

The invention and objects and features thereof will be more readily apparent from the following detailed description and appended claims when taken with the drawings.

DETAILED DESCRIPTION OF THE ILLUSTRATIVE EMBODIMENTS

Figure 1:
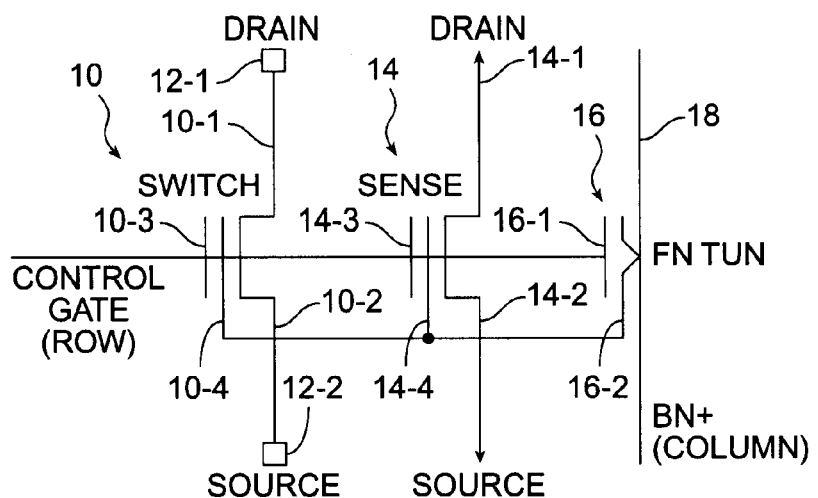
FIG. 1 is a schematic of a FPGA cell in accordance with one embodiment of the invention.

Referring now to the drawings, FIG. 1 is a schematic of one embodiment of a programmable interconnect cell in accordance with the invention. The cell includes a switch field effect transistor 10 having a first source/drain 10-1 and a second source/drain 10-2 which are connectable to circuit nodes of a field programmable circuit through contacts 12-1 and 12-2. Switch transistor 10 includes a control gate 10-3 and a floating gate 10-4 positioned between control gate 10-3 and the channel region of transistor 10.

The cell further includes a sense field effect transistor 14 having source/drain regions 14-1 and 14-2, a control gate 14-3 and a floating gate 14-4 positioned between control gate 14-3 and the channel region of field effect transistor 14.

The cell further includes a Fowler-Nordheim (FN) tunneling device 16 having a control electrode 16-1 and a floating gate electrode 16-2 positioned between the control gate 16-1 and a voltage biased conductive line 18. In this embodiment the field effect transistors are N- channel devices, and the voltage biased conductive line 18 is a buried N+ column line diffused in the semiconductor substrate in which the programmable interconnect cell is fabricated.

The control gates of the switch transistor, sense transistor, and FN device are formed from a first doped polysilicon layer and are interconnected thereby. The control gates of the field effect transistors and the FN device are formed from a second polysilicon layer which interconnects the control gates and is self-aligned with the underlying floating gates in a row. The underlying first polysilicon layer of the floating gate is restricted to the programmable interconnect cell, while the second polysilicon layer of the control gate extends to adjacent cells in the same row. The voltage biased conductive line 18 extends in a column to adjacent cells in other rows, and the source/drain regions of the sense transistor extend to the source/drain regions of sense transistors in adjacent cells in other rows.

Figure 2:
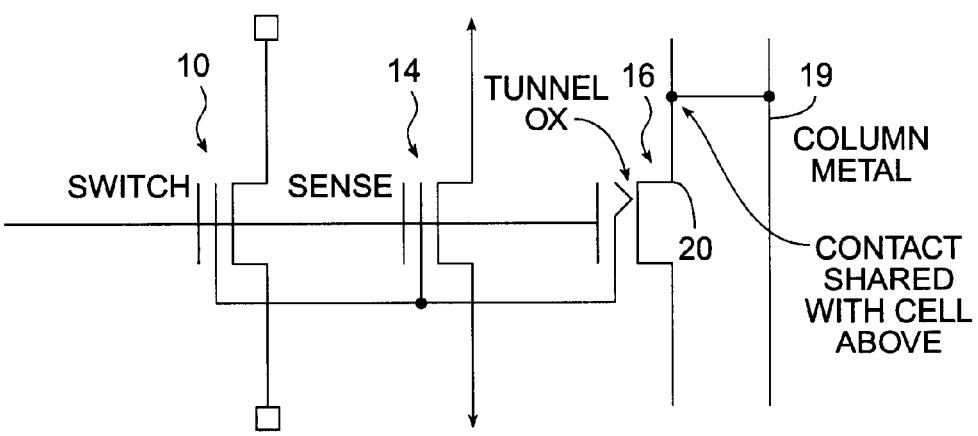
FIG. 2 is a schematic of a FPGA cell in accordance with another embodiment of the invention.
Figure 3:
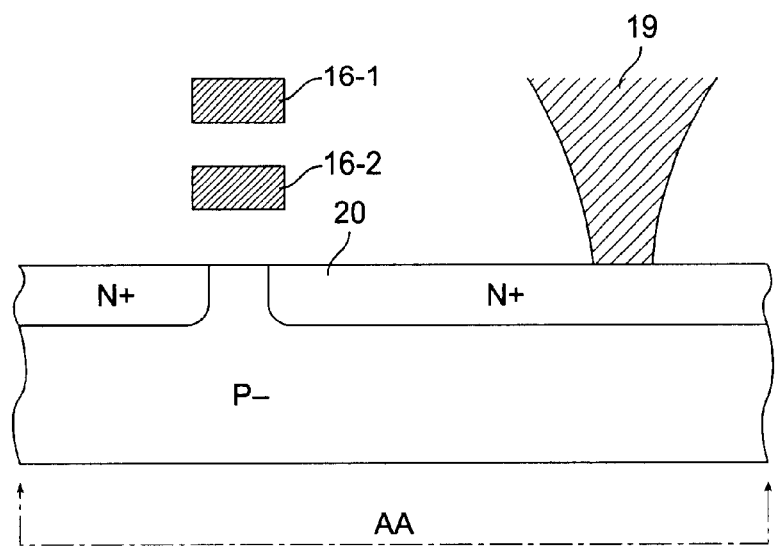
FIG. 3 is a section view illustrating the FN device in the cells of FIGS. 1 and 2.

FIG. 2 is a schematic of an alternative embodiment of a programmable interconnect cell including a switch transistor 10, sense transistor 14, and FN tunneling device 16. However, in this embodiment the voltage biased conductive line comprises a metal column line 19 on the surface of the semiconductor substrate. As shown in FIG. 3, metal line 19 is interconnected to an N+ doped region 20 in the semiconductor substrate which is spaced from the floating gate 16-2 of the FN device by a tunnel oxide having a thickness on the order of 90–120 Å.

Figure 4:
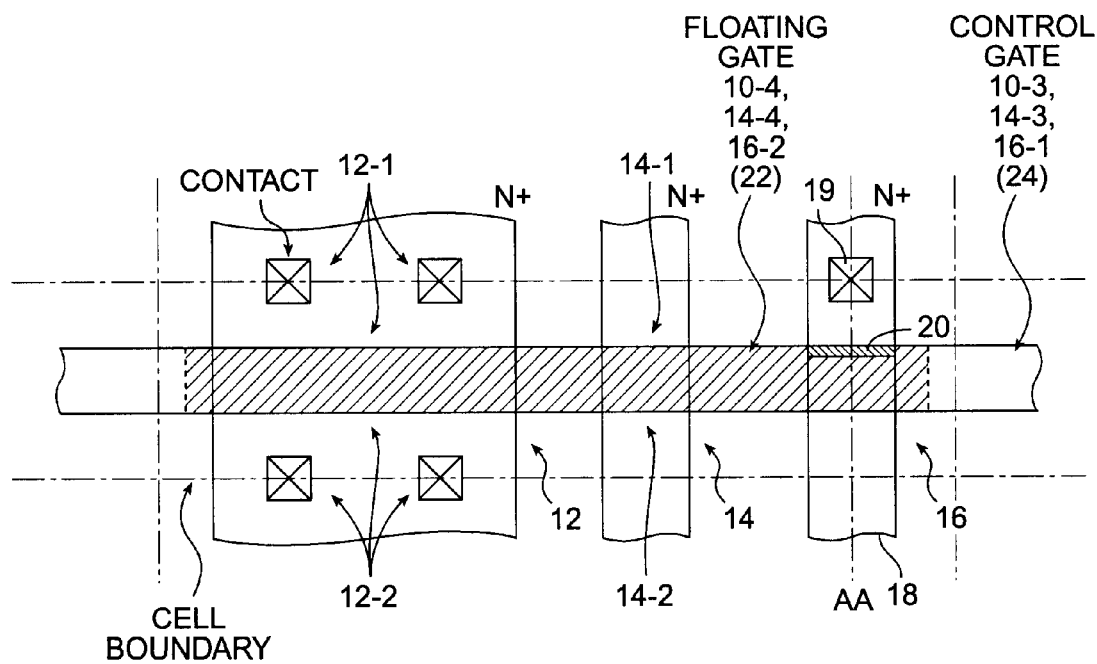
FIG. 4 is a plan view of the cell of FIG. 1.

FIG. 4 is a plan view of the cells of FIGS. 1 and 2. The cross-hatched first polysilicon layer 22 which forms the floating gates of the switch transistor, sense transistor and FN device is restricted to the cell, whereas the overlying and self-aligned second polysilicon layer 24 extends to adjacent cells in the same row. The diffused source/drain regions 14-1/14-2 of sense amplifier 14 extend to the source/drain regions of sense transistors in adjacent rows. Likewise, the BN+ line 18, or metal column line 19, extends to FN devices in adjacent rows.

Figure 5:
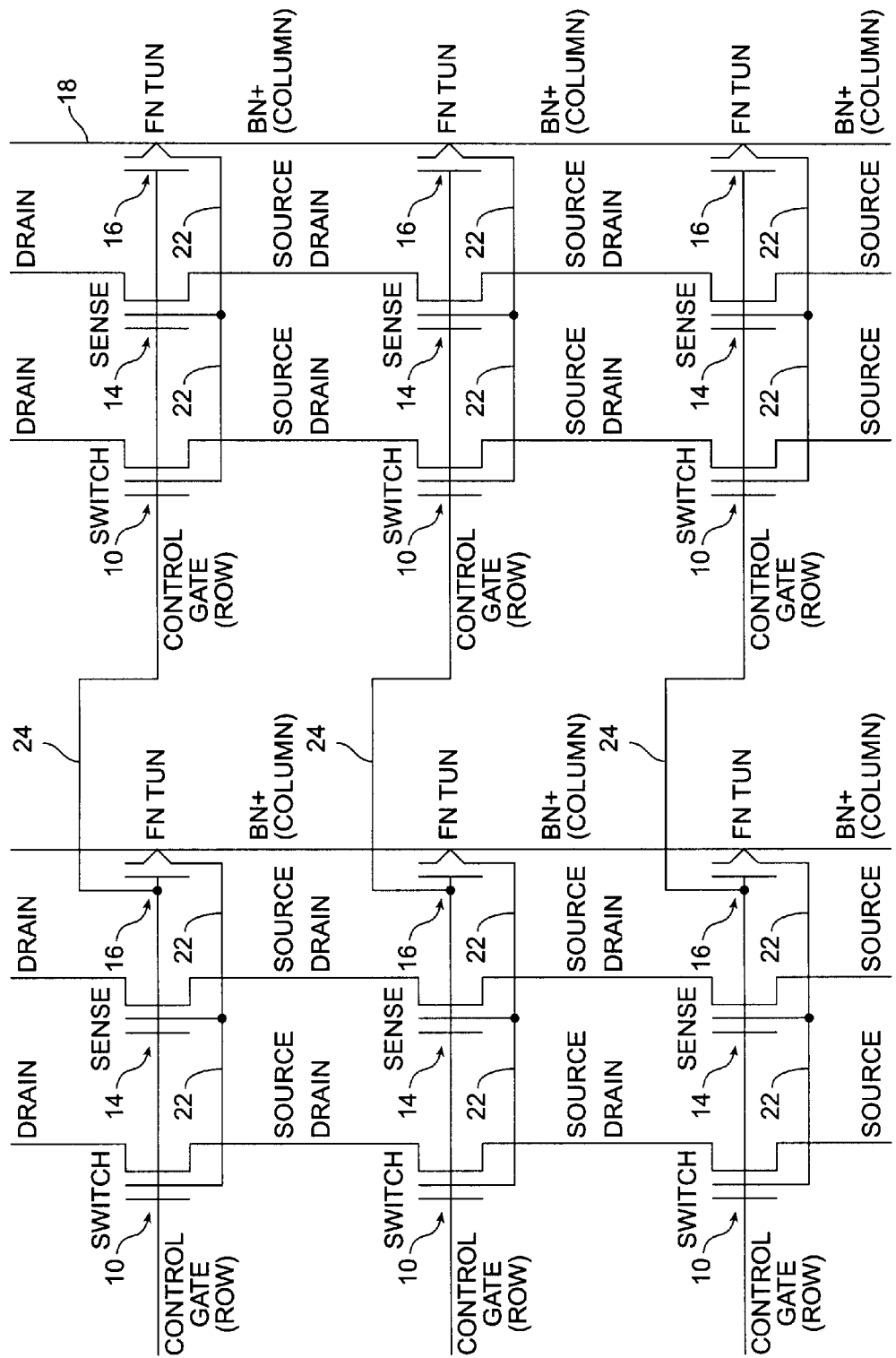
FIG. 5 is a schematic of an array of FPGA cells of FIG. 1.
Figure 6:
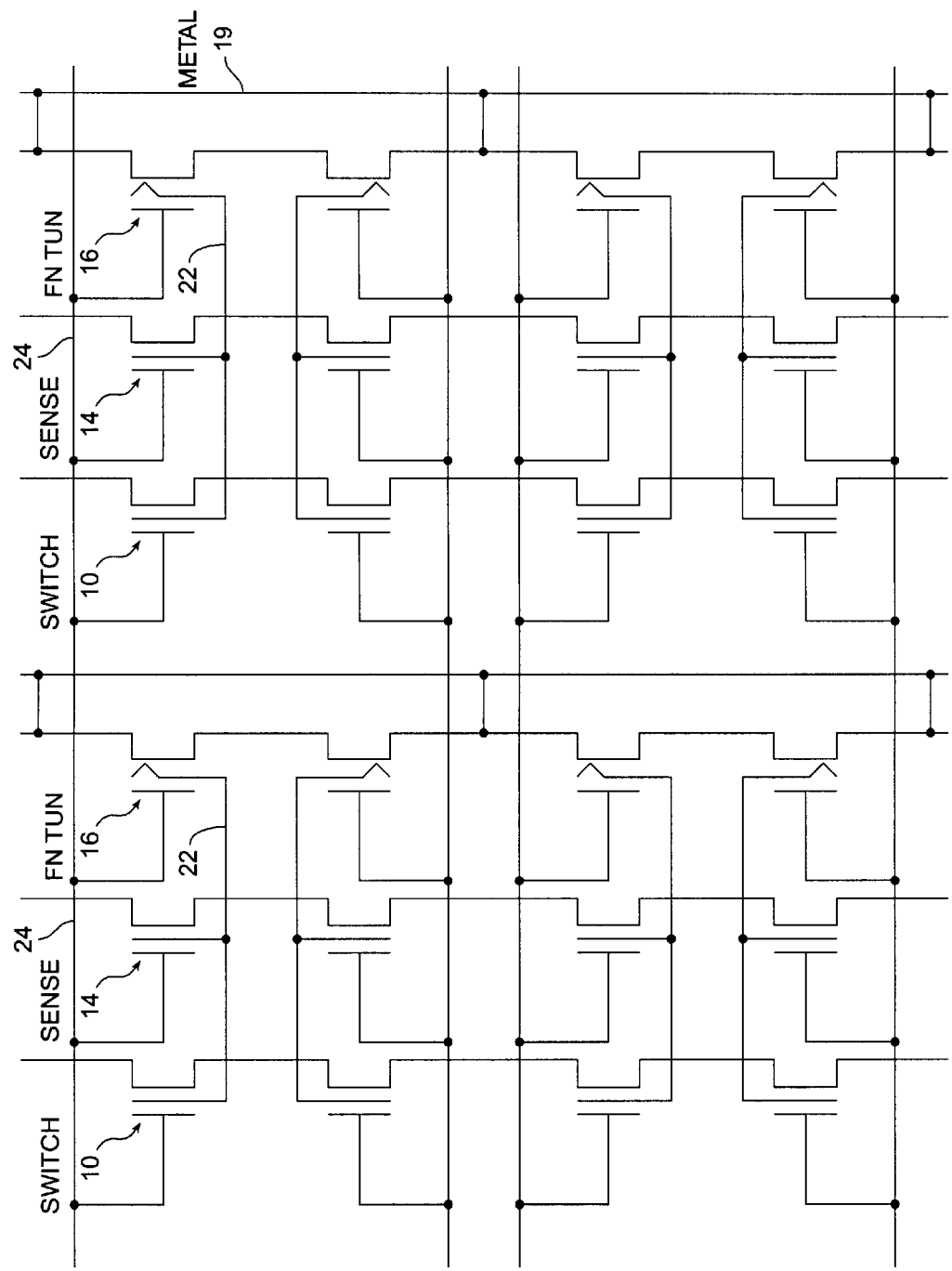
FIG. 6 is a schematic of an array of FPGA cells of FIG. 2.

FIG. 5 is a schematic of a three row by two column array of programmable interconnect cells in accordance with FIG. 1, and FIG. 6 is a schematic of a three row by two column array of programmable interconnect cells in accordance with the schematic of FIG. 2. These array schematics further illustrate the second polysilicon layer 24 extending to adjacent cells in an array while the first polysilicon oxide interconnecting the floating gates is restricted to each cell. The switch transistors are connected to nodes of an FPGA circuit while the source/drain regions of the sense transistors extend vertically to the source/drain regions of sense transistors in adjacent rows.

In one embodiment rows of interconnect cells are grouped by files (32 rows by 5 columns). The measurement of programmed and erased sense transistor thresholds in each bit in this stack of sense transistors is performed in the same manner that a NAND ROM is accessed. That is, by biasing "on" each unselected bit's sense transistor of the stack and margining the selected bit. This measurement, "margining", is done by varying the selected cell's control gate, (row), voltage while detecting whether drain current is above or below some reference level. The row biases are applied by row drivers. These circuits have several modes of operation and must supply high positive voltages with respect to the array during "erase" and they must supply positive and negative voltages to the rows during "program" and "read". Further, the row drivers must supply a constant positive bias during operating mode. The column biases are applied by column drivers. These drivers must drive to a positive voltage to "program" and provide a low positive level while sensing current during "read". Otherwise, the column biases are either ground or open circuited. The following table gives approximate row and column, peak voltage levels for all operating modes. Program disturb is reduced to tolerable levels by overlapping row select/unselect window with the column select/unselect window by $V_{uud}$. This voltage will stress programmed bits whose rows and columns are both unselected, but reduce programming stress on erased bits where only the row or column, but not both, are unselected.

|  | Erase | Program | Read/Margin | Operate |
| --- | --- | --- | --- | --- |
| Selected Row | Ramp to $V_{ERASE}$ | Ramp to $-V_P/(2*R_R)$ | $-V_R$ to $+V_R$ | OV to VCC |
| Selected Column | OV | Ramp to $+V_P/(2*(1-R_c))$ | ≈1V | OV to VCC |
| Unselected Row | — | $V_{UUD}$ | $-V_R + \Delta$ | OV to VCC |
| Unselected Column | — | OV | OV | OV to VCC |
| Read Select Row in Selected Tile | OV | OV | VCC | OV |

Figure 7:
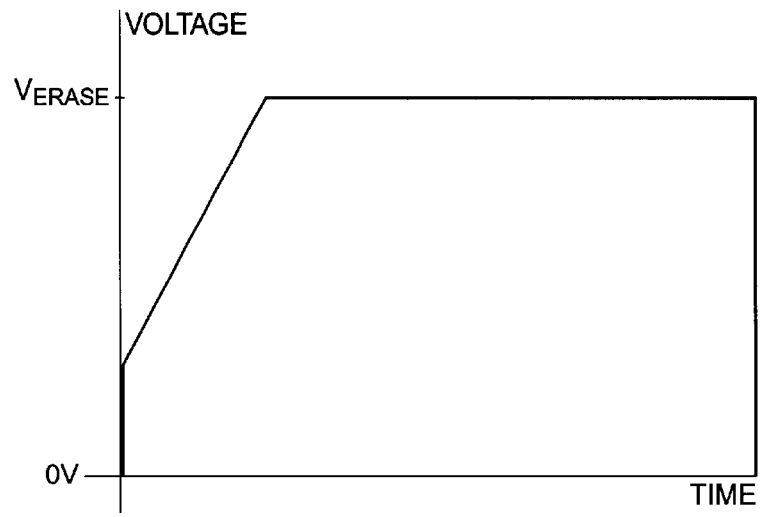
FIG. 7 is an erase voltage waveform as applied to rows in an FPGA cell array, in accordance with the invention.

FIG. 7 shows the voltage waveforms applied to rows during erase operations. All other nodes are at ground. Since this is a bulk operation, no disturb will occur. During erase, electrons tunnel from the sense transistor drain/source and channel which has its surface in inversion, to the floating polysilicon gate. This leaves a negative charge on the floating gate of the switch and the sense transistor, causing them to be "off" unless a complementary voltage is coupled onto the floating gate from the row (control gate).

The writing or "programming" operation (FIGS. 8A–8D) is used to place selected, erased switch and sense transistors back in the "on" state. This is accomplished by forcing a negative voltage on the row and a positive voltage on the column. The floating gate will be driven negative with respect to the sense transistor drain and source, and electrons will tunnel from the floating gate to the drain junction, which as illustrated in FIG. 3 is engineered to extend under the floating gate and polysilicon gate stack on one or both sides. This operation leaves a net positive charge on the floating gate which moves the switch and sense transistors to the "on" state.

Figure 8A:
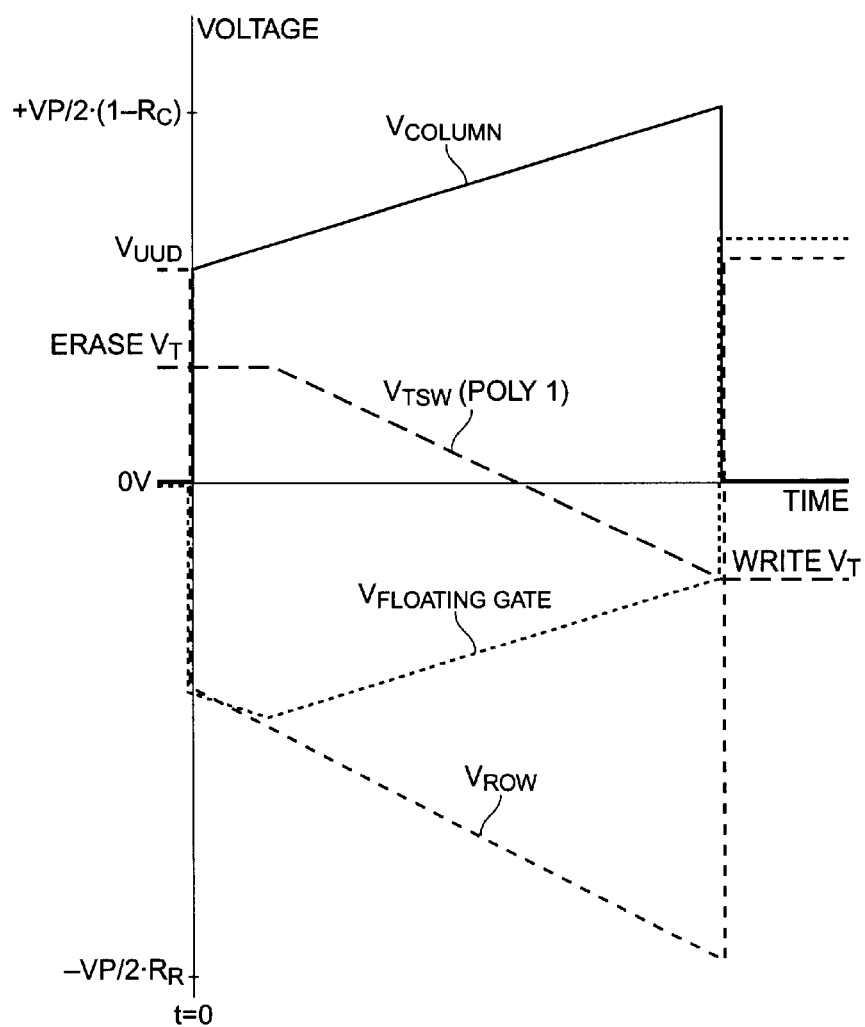
FIG. 8A illustrates programming voltage waveforms for a selected cell.

FIG. 8A illustrates waveforms for the selected row and column during "program" operation. The row (control gate) is ramped negatively while the column lines are ramped positively to remove electrons from the floating gate which leaves a net positive charge on the floating gate after programming.

Figure 8B:
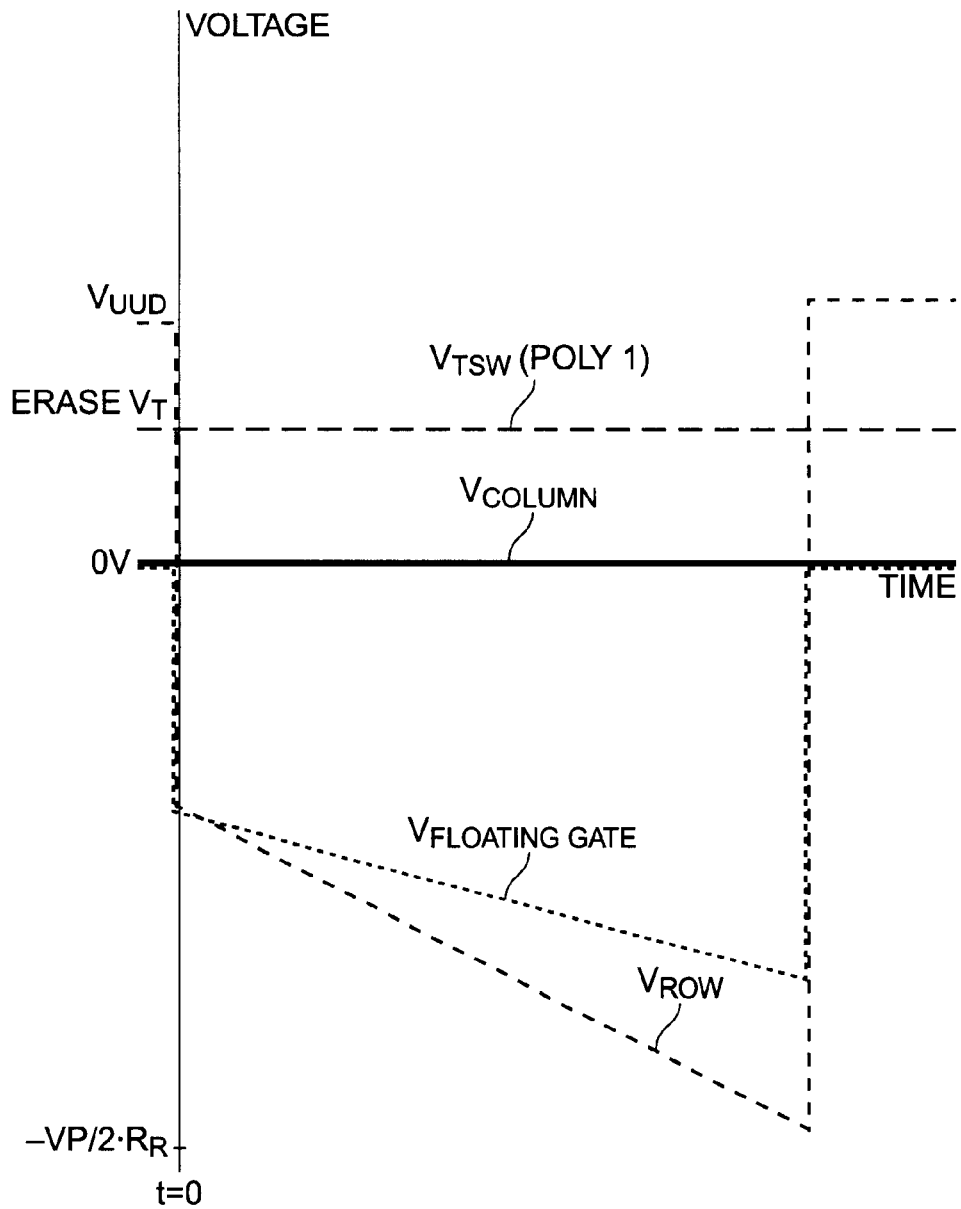
FIG. 8B illustrates voltage waveforms for an unselected programming waveform (selected row, unselected column).

FIG. 8B illustrates the waveforms as applied for a selected row and unselected column during a "program" operation.

Figure 8C:
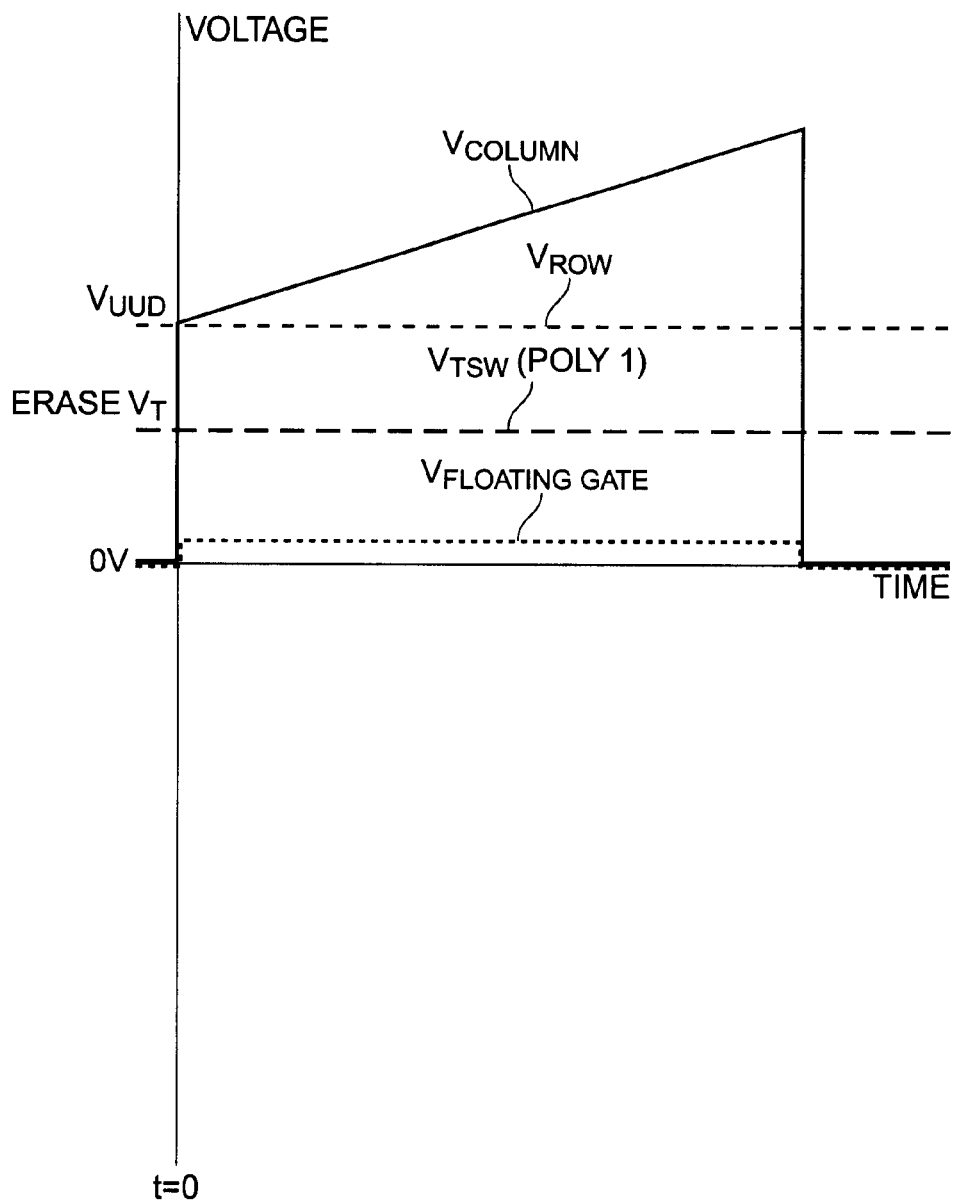
FIG. 8C illustrates an unselected program waveform (unselected row, selected column).

FIG. 8C illustrates the voltage waveform for an unselected row and selected column during "program" operation.

Figure 8D:
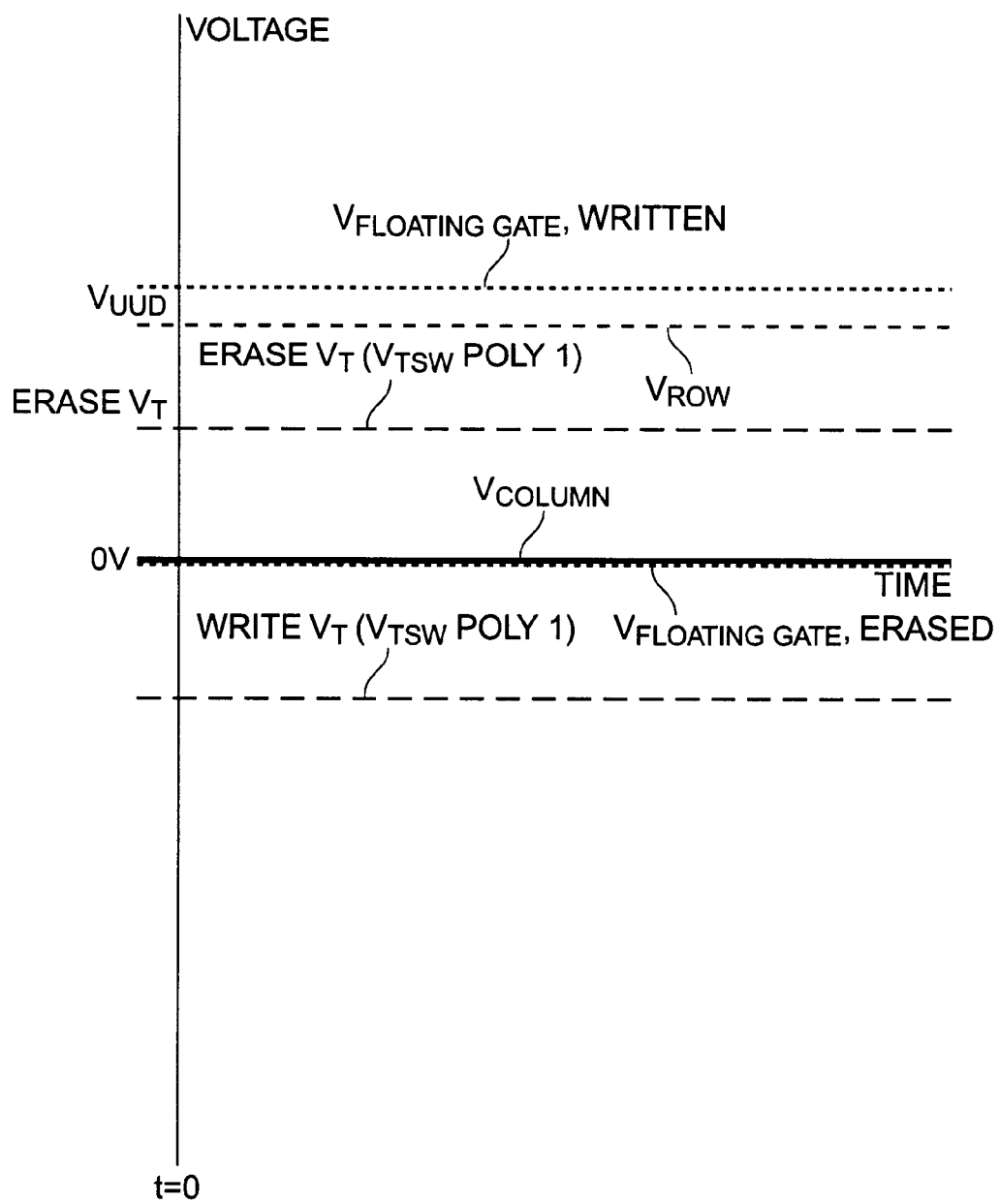
FIG. 8D illustrates an unselected programming waveform (unselected row, unselected column).

FIG. 8D illustrates voltage waveforms for both row and column unselected during a "program" operation.

Figure 9:
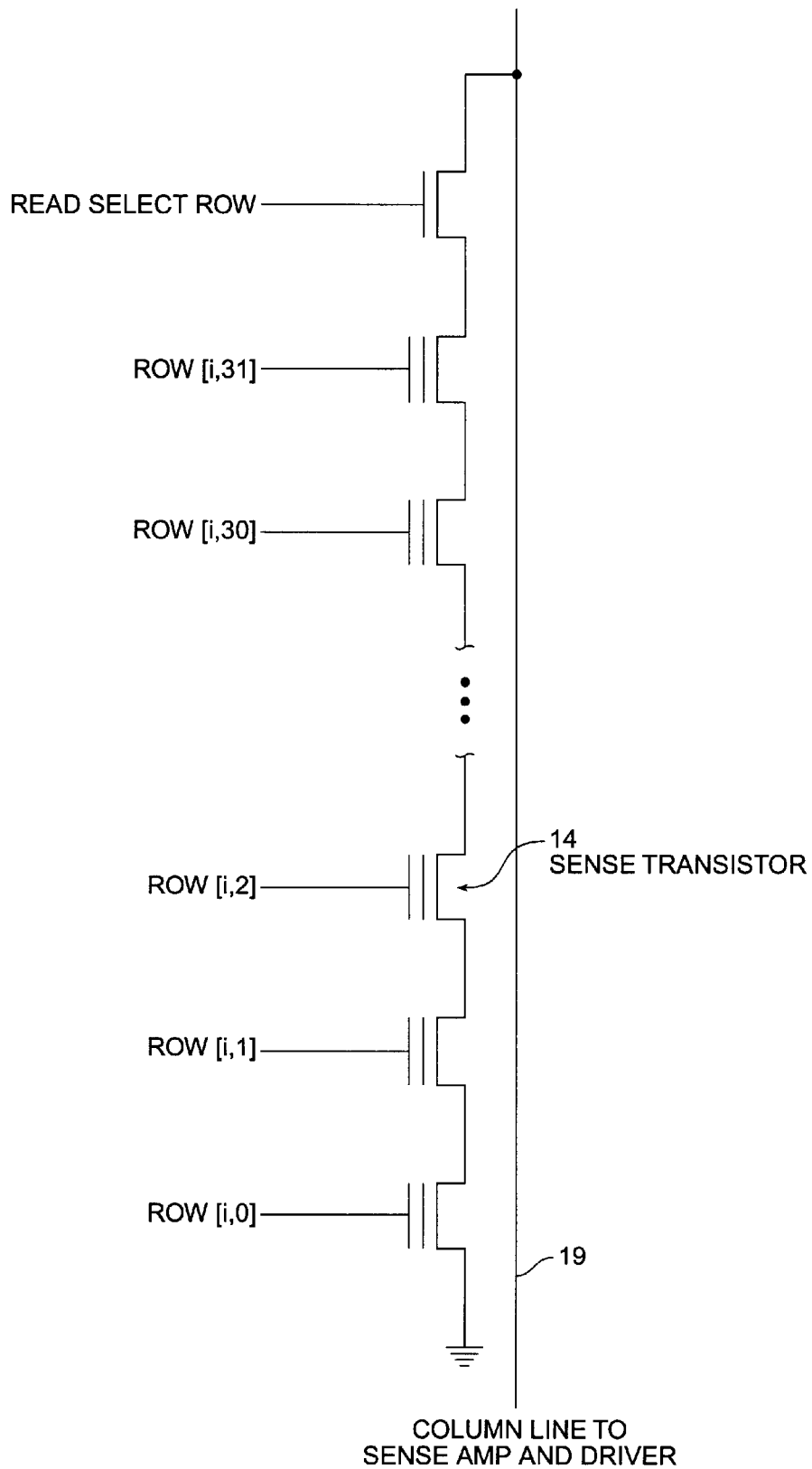
FIG. 9 illustrates a read access sense transistor stack schematic for a single tile with column, ground, and select transistor connections.

FIG. 9 illustrates a Read Access sense transistor stack with sense amplifiers 14 controlled by Row addresses and column line 19.

During a read margining operation, the sense transistor in the selected tile is weakly turned "on" and all unselected rows in the rest of the tile are brought to a positive voltage to turn them "on" hard. Additionally, the read select row for the tile being accessed is turned on. All other rows and read select rows in the array are left at 0.0 volt. The selected row voltage is ramped high for an "erased" bit. When the column reaches a threshold current with the bias set to a low voltage, the row voltage is recorded as the "erase margin" for that bit. Similarly, the row voltage is ramped negative for a programmed bit and the voltage on the threshold current is the "program margin".

In the FPGA operating mode, positive DC bias is applied to all rows. This shifts the voltage window of operation of the switches from slightly "off" for the erased cells to strongly "on" for the programmed cells and allows full swing signals to pass through the "on" switches while not disturbing any current through the "off" switches.

Write disturb is minimized by overlapping select/unselect windows of voltages applied to rows and columns during programming. This reduces the disturb area on the unselected cells that have either their row or column selected, but increases the disturb bias on cells that have neither their rows nor columns selected. The row and column voltage window are overlapped to minimize programming disturb in all cases.

By applying opposite polarity time linear voltage ramps to the selected row and column, charge removal from unselected cells on selected rows or columns relative to the effects on other waveforms is minimized.

Column programming can be used instead of conventional row programming to reduce the overall disturb. The advantage of this approach is that due to row and column coupling ratio differences, the disturb of unselected rows may be higher than that of unselected columns. A disadvantage of this approach, however, is that column programming is more costly to implement in terms of circuit area, testing complexity and test time.

The described FPGA cell and array are readily fabricated using conventional EEPROM-CMOS processing with few masks. By using the tunnel oxide for programming and erasing, the use of non-self-aligned EPROM cell structures and associated masking processing steps are avoided.

The fabrication process is easier to control since there are fewer steps and process parameters. The cell operation improves program retention, reduces "disturb" or immunity to other programmed cells. Use of a single FN device for both programming and erase provides better yield, reliability and control. Further, the cell requires less area than prior art cells. Since hot electron injection is not used, the programming current is reduced and access is faster.

While the invention has been described with reference to specific embodiments, the description is illustrative of the invention and is not to be construed as limiting the invention. Various modifications and applications may occur to those skilled in the art without department from the true spirit and scope of the invention as defined by the appended claims.

What is claimed is:

1. A programmable interconnect cell for selectively connecting circuit nodes of an integrated circuit in a semiconductor substrate comprising:

a switch field effect transistor having first and second source/drains respectively connectable to first and second circuit nodes, a floating gate for storing charge, and a control gate for turning the switch transistor on and off at a threshold responsive to charge on the floating gate, a sense field effect transistor having first and second source/drains, a floating gate for storing charge, and a control gate for turning the sense transistor on and off responsive to charge on the floating gate, and an electron tunneling device having a floating gate for the tunneling of electrons to and from a voltage biased conductive line, and a control gate overlying the floating gate for controlling the tunneling of electrons to and from the floating gate, means interconnecting the floating gates of the switch transistor, the sense transistor, and the electron tunneling device, and means interconnecting the control gates of the switch transistor, the sense transistor, and the electron tunneling device, whereby programming and erasing the switch transistor is effected by the tunneling of electrons to and from the floating gate in the electron tunneling device.

2. The programmable interconnect cell as defined by claim 1 wherein the floating gates and control gates are aligned in a row, the floating gate being restricted to the cell while the control gate extends to adjacent cells in the row.

3. The programmable interconnect cell as defined by claim 2 wherein the first and second source/drains of the sense transistor extend to first and second source/drains of sense transistors in adjacent rows.

4. The programmable interconnect cell as defined by claim 3 wherein the voltage biased conductive line comprises a buried N+ layer in the substrate.

5. The programmable interconnect cell as defined by claim 4 wherein the spacing of the N+ layer and the floating gate of the electron tunneling device is in the range of 90 Å–120 Å.

6. The programmable interconnect cell as defined by claim 4 wherein the N+ buried layer extends in a column perpendicular to the row to adjacent cells.

7. The programmable interconnect cell as defined by claim 6 wherein the switch transistor and the sense transistor comprise in channel field effect transistors.

8. The programmable interconnect cell as defined by claim 3 wherein the voltage biased conductive line comprises a metal line on a surface of the substrate, and further including an N+ region formed in the substrate underlying and spaced from the floating gate of the electron tunneling device and connected to the metal line.

9. The programmable interconnect cell as defined by claim 8 wherein the spacing of the N+ region and the floating gate of the electron tunneling device is in the range of 90 Å–120 Å.

10. An array of programmable interconnects for selectively connecting circuit nodes of an integrated circuit in a semiconductor substrate comprising:

a plurality of interconnect cells arranged in rows and columns and each cell being programmable to connect and disconnect circuit nodes, each cell having:
 a switch field effect transistor having first and second source/drains respectively connectable to first and second circuit nodes, a floating gate for storing charge, and a control gate for turning the switch transistor on and off at a threshold responsive to charge on the floating gate,
 a sense field effect transistor having fist and second source/drains, a floating gate for storing charge, and a control gate for turning the sense transistor on and off at a threshold responsive to charge on the floating gate, and
 an electron tunneling device having a floating gate for the tunneling of electrons to and from a voltage biased conductive line, and a control gate overlying the floating gate for controlling the tunneling of electron to and from the floating gate,
 means interconnecting the floating gates of the switch transistor, the sense transistor, and the electron tunneling device, and means interconnecting the control gates of the switch transistor, the sense transistor, and the electron tunneling device, whereby programming and erasing the switch transistor is effected by the tunneling of electrons to and from the floating gate in the electron tunneling device.

11. The array as defined by claim 10 wherein the floating gates and control gates are aligned in a row, floating gate being restricted to a cell while the control gate extends to adjacent cells in the row, the source/drain regions of each sense transistor extending to source/drain regions of sense amplifiers in adjacent rows.

12. The array as defined by claim 11 wherein the voltage bias conductive line comprises a buried N+ layer in the substrate.

13. The array as defined by claim 12 wherein the spacing of N+ layer and the floating gate of the electron tunneling device is in the range of 90 Å–120 Å.

14. The array as defined by claim 12 wherein the N+ buried layer extends in a column perpendicular to the row to adjacent cells.

15. The array as defined by claim 14 wherein the floating gates and control gates are aligned in a row, the floating gate being restricted to the cell while the control gate extends to adjacent cells in the row, the source/drain regions of each sense transistor extending to the source/drain regions of sense transistors in adjacent rows.

16. The array as defined by claim 11 wherein the voltage bias conductively line comprises a metal line on a surface of the substrate, and further including an N+ region spaced from the floating gate of the electron tunneling device and connected to the metal line.

17. The array as defined by claim 16 wherein the spacing of the N+ region and the floating gate of the electron tunneling device is in the range of 90 Å–120 Å.

* * * * *